United States Patent

Su et al.

[11] Patent Number: 6,135,522
[45] Date of Patent: Oct. 24, 2000

[54] SUCKER FOR TRANSFERRING PACKAGED SEMICONDUCTOR DEVICE

[75] Inventors: Jau-Yuen Su; Su Tao, both of Kaohsiung, Taiwan

[73] Assignee: Advanced Semiconductors Engineering, Inc., Kaohsiung, Taiwan

[21] Appl. No.: 09/318,220

[22] Filed: May 26, 1999

[51] Int. Cl.[7] .................................................. B25J 15/06
[52] U.S. Cl. ........................................... 294/64.1; 29/743
[58] Field of Search ...................... 294/64.1, 65; 29/743; 269/21; 901/40

[56] References Cited

U.S. PATENT DOCUMENTS

| | | | |
|---|---|---|---|
| 4,887,351 | 12/1989 | Porterfield et al. | 294/64.1 X |
| 5,207,465 | 5/1993 | Rich | 294/64.1 X |
| 5,456,510 | 10/1995 | Coots et al. | 294/64.1 |

FOREIGN PATENT DOCUMENTS

| | | | |
|---|---|---|---|
| 2495592 | 6/1982 | France | 294/64.1 |
| 60984 | 3/1991 | Japan | 294/64.1 |
| 8600294 | 9/1987 | Netherlands | 294/64.1 |
| 682072 | 7/1993 | Switzerland | 294/64.1 |

*Primary Examiner*—Johnny D. Cherry
*Attorney, Agent, or Firm*—Rosenberg, Klein & Lee

[57] ABSTRACT

A sucker for transferring packaged semiconductor devices is provided, which includes a position rod, an elastic buffer and a sponge. The position rod defines an air extraction channel in an axial direction thereof. The elastic buffer pad defines an aperture to hold an end of the position rod and a first air hole communicated with the aperture and the air extraction channel. The sponge is attached to the elastic buffer pad. The sponge defines a second air hole communicated with the first air hole. Therefore, when air is extracted through the air holes and air extraction channel, the sponge is provided with an absorbent force to securely catch a packaged semiconductor device.

3 Claims, 6 Drawing Sheets

| PACKAGED SEMICONDUCTOR DEVICE \ SPONGE AREA | 6 X 6 | 8 X 12 |
|---|---|---|
| 6 X 8 | OK | OK |
| 7 X 7 | OK | OK |
| 8 X 9 | OK | OK |
| 8 X 14 | OK | OK |

UNIT : mm

FIG. 5

SUCKER FOR TRANSFERRING PACKAGED SEMICONDUCTOR DEVICE

FIELD OF THE INVENTION

The present invention relates to a sucker for transferring packaged semiconductor devices, and more particularly, to a sucker which is able to catch packaged semiconductor devices having different dimensions without the risk of damaging the packaged semiconductor device.

PRIOR ART

In the semiconductor manufacturing process, a sucker is often used to catch a packaged semiconductor device to transfer it to a desired position.

FIG. 6 shows the structure of another conventional sucker which includes a position rod (90) connected to a gear shaft (not shown) and a sealing pad (91) mounted on the bottom portion of the position rod (90). Each of the sealing pad (91) and the position rod (90) defines an air extraction channel (901, 911). The two channels (901, 911) are axially aligned and communicate with each other. The sealing pad (91) is of a rectangular shape and made of elastic material such as rubber. A chamber (92) is defined in the lower portion of the sealing pad (91).

When the sucker is used to catch a packaged semiconductor device (80) as shown in FIG. 7, the bottom face of the sealing pad (91) attaches to the peripheral portion of the bottom face of the packaged semiconductor device (80) and the solder balls (81) are in the chamber (92) without being bumped. The chamber (91) becomes hermetic when air is extracted off via the extraction channels (901, 911) whereby the sucker can securely catch the packaged semiconductor device (80).

The above sucker suffers a disadvantage in that the dimensions of the sealing pad (91) and the chamber (92) have to match with the size of the packaged semiconductor device (80). Otherwise, the sealing pad (91) cannot securely attach to the bottom face of the packaged semiconductor device (80) and the solder balls (81) may be damaged. Therefore, sealing pads (91) with different dimensions have to be provided for different semiconductor devices, which results in an inconvenience in stocking management and high manufacturing cost.

Furthermore, the above conventional sucker cannot apply to catch other types of semiconductor devices such as the BCC (Bump Chip Carrier) packaged semiconductor device. With reference to FIG. 8, the BCC (Bump Chip Carrier) packaged semiconductor device (83) has multiple solder points (82) located on the edge of the bottom face thereof. Because the solder points (82) are protruded from the bottom face of the BCC packaged semiconductor device (83), a gap is defined between every two adjacent solder points (82). Therefore, if the sealing pad (91) of the above sucker is used to attach to the peripheral portion of the bottom face of the BCC packaged semiconductor device (83), it is hard for the chamber (92) to become hermetic and the BCC packaged semiconductor device (83) cannot be caught because that air may flow through those gaps. Consequently, there is a need to improve the conventional suckers such that the aforementioned problems can be mitigated and/or obviated.

FIG. 9 shows an exploded view of an intermediate sucker developed in the laboratory to obviate the aforementioned problems, which includes a geared shaft (70), a position rod (71) inserted into the lower end of the geared shaft (70), and a sponge (72) partially received in the position rod (71). Each of the geared shaft (70) and the position rod (71) defines an axial air extraction channel (701, 711). The two channels (701, 711) are axially aligned and communicate with each other. The position rod (71) further defines a chamber (712) in the lower portion thereof, which communicates with the air extraction channel (711) and has a larger diameter than that of the air extraction channel (711). The sponge (72) is partially received in the chamber (712) such that a proper thickness of the sponge (72) is exposed out of the position rod (71).

With reference to FIG. 10, a cross sectional view of an assembled and still an intermediate sucker is shown. The sucker is also a product in the laboratory developed to solve the aforementioned problems, wherein the sucker catches a packaged semiconductor device (80) in such a manner that the exposed portion of the sponge (72) is used to attach to the bottom face of the packaged semiconductor device (80) which has multiple solder balls (81) formed thereon. When air is extracted via the air extraction channels (701, 711), the sponge (72) is provided with an absorbent force to securely catch the packaged semiconductor device (80).

Such a sucker is capable of catching a packaged semiconductor device in the semiconductor manufacturing process. However, when the sponge (72) attaches to the bottom face of the packaged semiconductor device (80), the sponge (72) will be compressed and deformed so that the distance between the position rod (71) and the bottom face of the packaged semiconductor device (80) is decreased. It is likely that the bottom face of the packaged semiconductor device (80) may bump to the position rod (71), which is made of hard metal material, and the solder balls (81) may be damaged. Consequently, the yield rate of the semiconductor devices is decreased.

SUMMARY OF THE INVENTION

The objective of the present invention is to provide a sucker for transferring packaged semiconductor devices having different dimensions without the risk of damaging the packaged semiconductor device.

To achieve the objective, the sucker in accordance with the present invention includes a position rod defining an air extraction channel in an axial direction thereof, an elastic buffer pad defining an aperture to hold an end of the position rod and a first air hole communicated with the aperture and the air extraction channel, and a sponge attached to the elastic buffer pad. The sponge defines a second air hole communicated with the first air hole. Therefore, when air is extracted through the air holes and air extraction channel, the sponge is provided with an absorbent force to securely catch a packaged semiconductor device.

Other objectives, advantages, and novel features of the invention will become more apparent from the following detailed description when taken in conjunction with the accompanying drawings.

BRIEF DESCRIPTION OF THE DRAWINGS

FIG. 5 is a test result showing that the sucker's sponges with different dimensions can effectively catch packaged semiconductor devices with various dimensions;

DETAILED DESCRIPTION OF THE PREFERRED EMBODIMENT

Figures 1, 6:
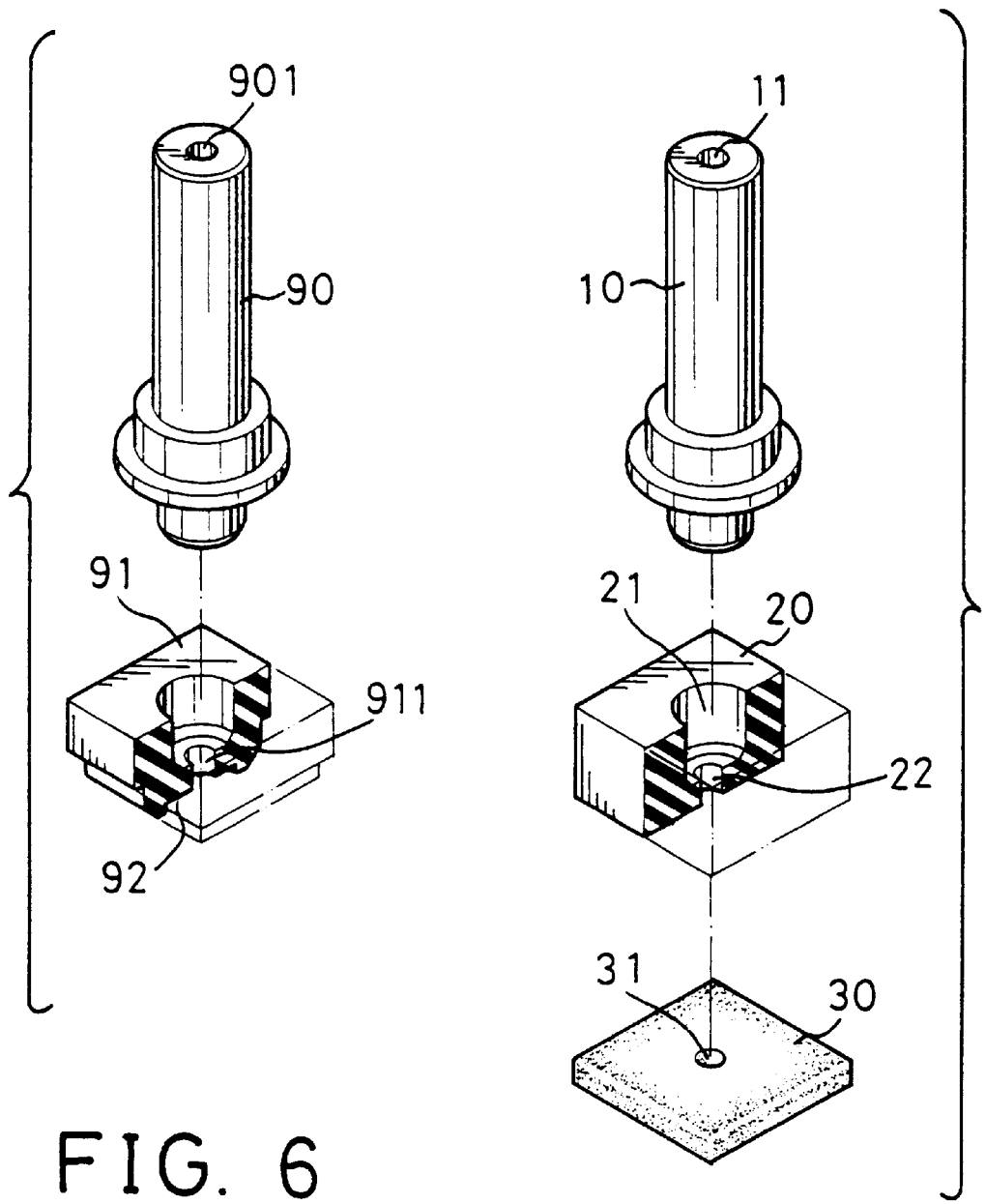
FIG. 1 is an exploded view and partial cross sectional view of a sucker in accordance with the present invention.
FIG. 6 is an exploded view of a conventional sucker.
Figure 2:
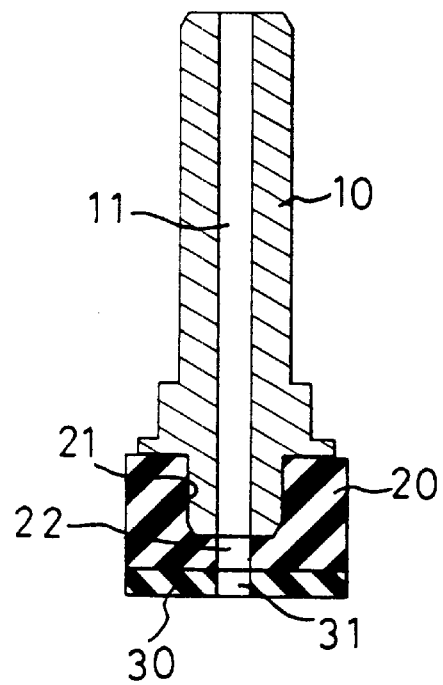
FIG. 2 is a cross sectional view of the sucker in accordance with the invention.

With reference to FIG. 1 and FIG. 2, the sucker in accordance with the present invention is shown, which includes a position rod (10) having an air extraction channel (11) defined in an axial direction thereof, an elastic buffer pad (20) mounted to the lower end of the position rod (10), and a sponge (30) attached to the bottom face of the buffer pad (20). The upper end of the position rod (10) is connected to a geared shaft (not shown) so that the position rod (10) can be moved to a desired position.

The buffer pad (20) is made of elastic material (such as rubber) and preferably has a rectangular shape. An aperture (21) is defined in the upper face of the buffer pad (20) and defines a round aperture (21) to hold the lower end of the position rod (10). The diameter of the aperture (21) is slightly less than that of the lower end of the position rod (10) such that the position rod (10) can be squeezed into the aperture (21) whereby the buffer pad (20) is secured to the lower end of the position rod (10).

Furthermore, the buffer pad (20) defines a first air hole (22) in the center thereof, which communicates with the aperture (21) and is aligned with the air extraction channel (11) in the position rod (10).

Preferably, the sponge (30) is attached to the elastic buffer pad (20) with adhesive. The sponge (30) is provided to directly contact with the packaged integrated circuit device which includes the solder balls or solder points. In order to avoid electrostatic damage to the packaged device, the sponge (30) is preferred to be anti-electrostatic sponge.

For accurately catching the packaged semiconductor device, the sponge (30) preferably has a rectangular shape to match with the buffer pad (20) and the packaged semiconductor device. The sponge (30) defines a second air hole (31) in the center thereof, which is aligned and communicates with the first air hole (22) of the buffer pad (20) and the air extraction channel (11) of the position rod. Therefore, when air is extracted through the air holes (22, 21) and air extraction channel (11), the sponge (30) is provided with an absorbent force to securely catch a packaged semiconductor device.

Figure 3:
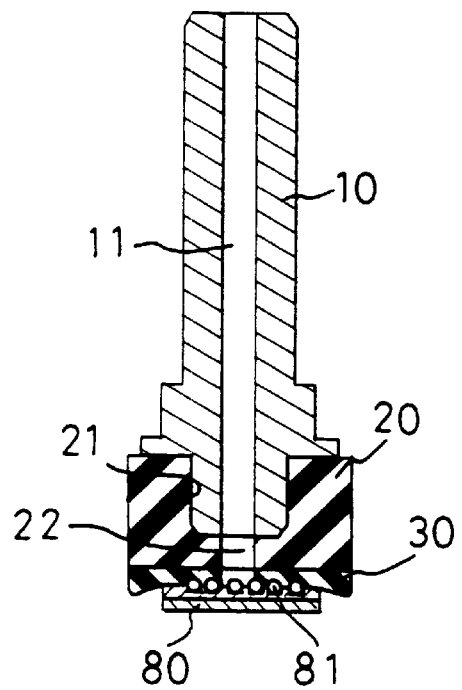
FIG. 3 is a cross sectional view of the sucker in accordance with the invention which catches a packaged semiconductor device.

FIG. 3 shows the sucker in accordance with the present invention used to catch a BGA (Ball Grid Array) packaged integrated circuit (80). Initially, the position rod (10) moves down until the sponge (30) touches the bottom face of the packaged semiconductor device (80). Although the bottom face of the packaged semiconductor device (80) is not even because there are multiple solder balls formed thereon, the sponge (30) is soft and elastic so that it can deform to fully attach to the bottom face of the packaged semiconductor device (80) thereby securely catching the packaged semiconductor device (80).

In the above operation, it is likely that the sponge (30) is compressed to its utmost and the packaged semiconductor device (80) may bump to the buffer pad (20). Because the buffer pad (20) is made of elastic material, the packaged semiconductor device will not be damaged.

Figure 4:
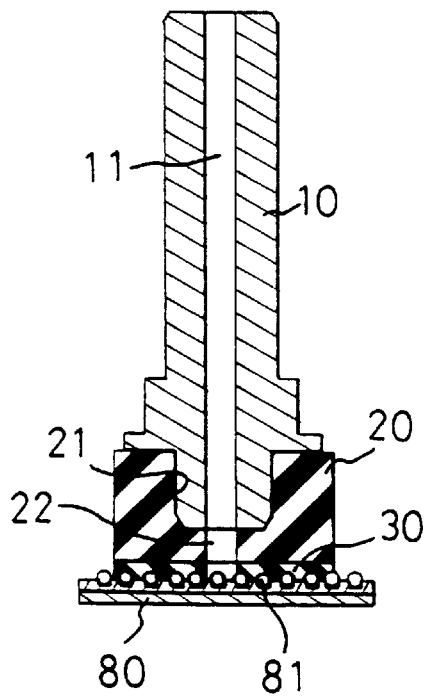
FIG. 4 is a cross sectional view of the sucker in accordance with the invention which catches another packaged semiconductor device.
Figure 10:
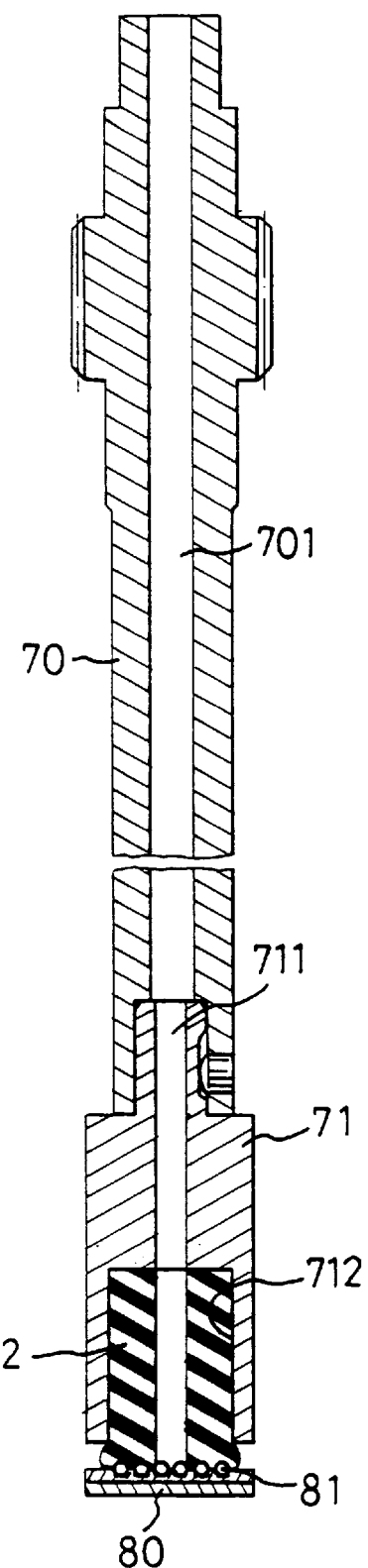
FIG. 10 is a cross sectional view of the sucker of FIG. 9 which catches a packaged semiconductor device.
Figure 7:
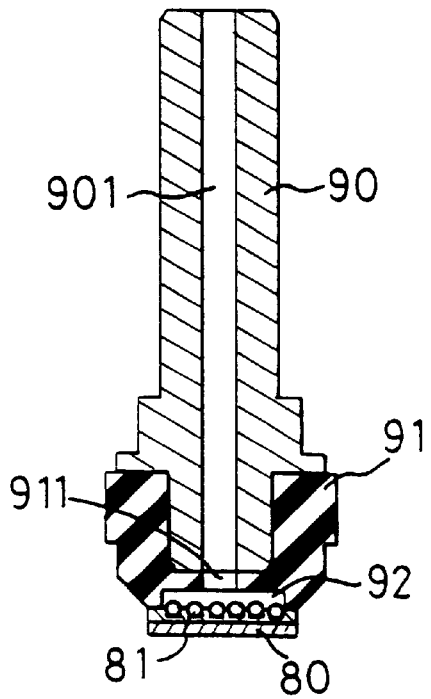
FIG. 7 is a cross sectional view of the conventional sucker which catches a packaged semiconductor device.
Figure 8:
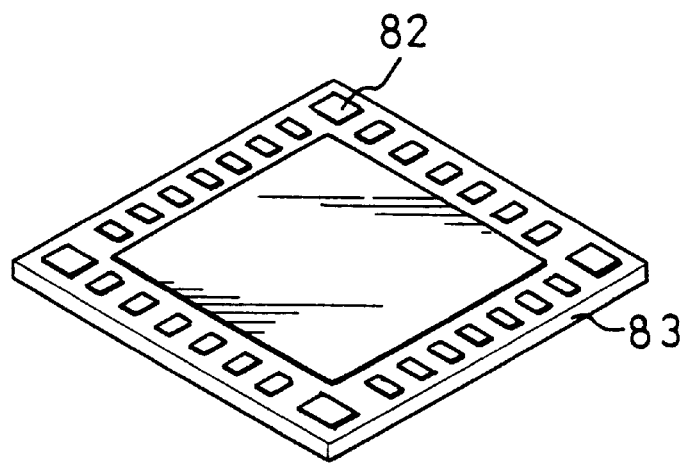
FIG. 8 is a schematic diagram showing the structure of a bump chip carrier packaged semiconductor device.
Figure 9:
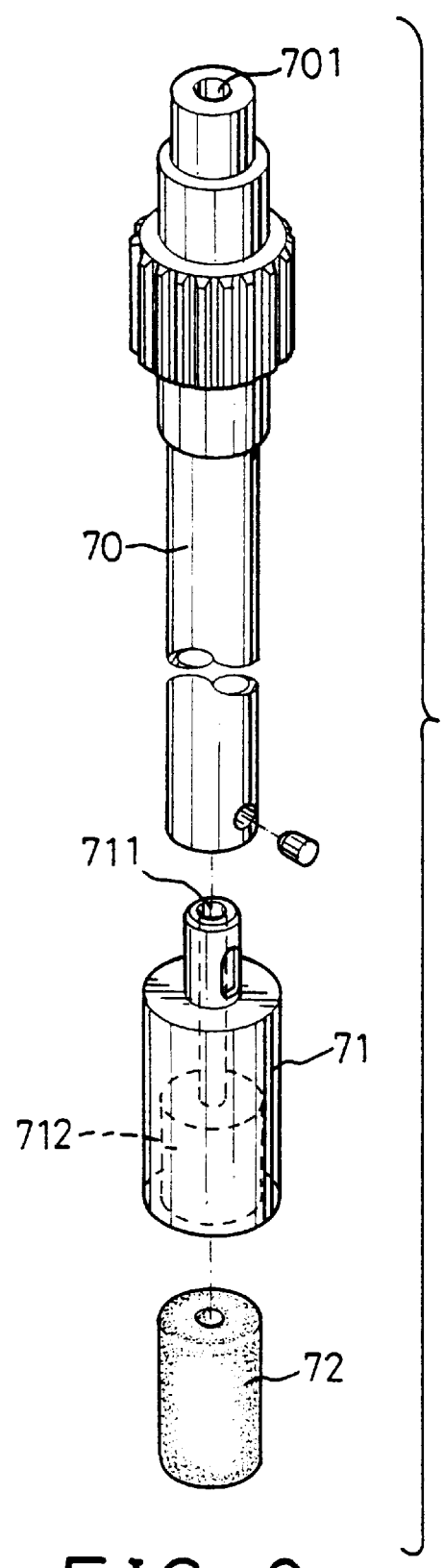
FIG. 9 is an exploded view of an experimental sucker.

Further, the sucker in accordance with the present invention has an advantage in that it can catch packaged semiconductor devices with different dimensions. With reference to FIG. 4, it is shown that the sucker is used to catch a packaged semiconductor device (80) that has a dimension larger than the sponge (30). Because the sponge (30) can attach to a packaged semiconductor device substantially without any limitation, it is still effective in catching the packaged semiconductor device even if the packaged semiconductor device is larger than the sponge (30). FIG. 5 gives a test result which shows that sponges with different dimensions can effectively catch packaged semiconductor devices with various dimensions.

In addition to catching the BGA packaged semiconductor device, the sucker in accordance with the present invention can be used to catch the BCC (Bump Chip Carrier) packaged semiconductor device. Because the sponge of the sucker is directly and completely attached to the packaged semiconductor device, the sponge can be properly deformed to securely catch the packaged semiconductor device even though there are solder points formed on the edge of the packaged semiconductor device.

Although the present invention has been explained in relation to its preferred embodiment, it is to be understood that many other possible modifications and variations can be made without departing from the spirit and scope of the invention as hereinafter claimed.

What is claimed is:

1. A sucker for catching and transferring packaged semiconductor devices, comprising:

a position rod (10) having an air extraction channel (11) formed axially therethrough;

an elastic buffer pad (20) having an aperture (21) formed in an upper surface thereof for coupling with an end of said position rod (10), said elastic buffer pad having a first air hole (22) formed in a lower surface thereof and in open communication with said aperture (21) and said air extraction channel (11); and a sponge (30) attached to said lower surface of said elastic buffer pad (20), said sponge (30) having a single second air hole (31) formed therethrough in open communication with said first air hole (22), said sponge (30) being sufficiently soft and elastic to conform to a packaged semiconductor's contours and thereby provide a vacuum seal when air is extracted from said air extraction channel (11).

2. The sucker for catching and transferring packaged semiconductor devices as claimed in claim 1, wherein said sponge (30) is attached to said lower surface of said elastic buffer pad (20) with adhesive.

3. The sucker for catching and transferring packaged semiconductor devices as claimed in claim 1, wherein said second air hole (31) is formed through a central portion of said sponge (30).

* * * * *

UNITED STATES PATENT AND TRADEMARK OFFICE
CERTIFICATE OF CORRECTION

PATENT NO. : 6,135,522
DATED : 24 October 2000
INVENTOR(S) : Jau-Yuen Su & Su Tao It is certified that error appears in the above-identified patent and that said Letters Patent is hereby corrected as shown below:

TITLE PAGE BLOCK [73]; delete the assignee name "Advanced Semiconductors Engineering, Inc." and insert the name --Advanced Semiconductor Engineering, Inc.--

Signed and Sealed this

Fifteenth Day of May, 2001

*Attest:*

NICHOLAS P. GODICI

*Attesting Officer*      *Acting Director of the United States Patent and Trademark Office*